United States Patent [19]

Tsui

[11] Patent Number: 5,499,391
[45] Date of Patent: Mar. 12, 1996

[54] DIGITAL CHANNELIZED IFM RECEIVER

[75] Inventor: James B. Y. Tsui, Dayton, Ohio

[73] Assignee: The United States of America as represented by the Secretary of the Air Force, Washington, D.C.

[21] Appl. No.: 269,317

[22] Filed: Jun. 30, 1994

[51] Int. Cl.$^6$ .......................... H04B 17/00; G01R 23/16; G01S 7/36

[52] U.S. Cl. .................... 455/226.2; 455/226.1; 324/76.22; 324/76.28; 342/13

[58] Field of Search .................. 455/226.1, 226.2; 324/76.22, 76.24, 76.28, 76.29, 76.35; 342/192, 13, 16, 195; 375/260, 340; 364/484, 485, 576

[56] References Cited

U.S. PATENT DOCUMENTS

| | | | |
|---|---|---|---|
| 4,194,206 | 3/1980 | Tsui et al. | 343/18 E |
| 4,612,545 | 9/1986 | Asendorf et al. | 343/18 E |
| 4,633,516 | 12/1986 | Tsui | 455/226 |
| 4,649,536 | 3/1987 | Krinock | 370/102 |
| 5,109,188 | 4/1992 | Sanderson et al. | 324/77 H |
| 5,198,748 | 3/1993 | Tsui et al. | 324/76.35 |
| 5,214,708 | 5/1993 | McEachern | 381/48 |
| 5,235,287 | 8/1993 | Sanderson et al. | 324/76.35 |
| 5,293,114 | 3/1994 | McCormick et al. | 324/76.22 |
| 5,315,307 | 5/1994 | Tsui et al. | 342/444 |
| 5,323,103 | 6/1994 | Choate et al. | 324/76.22 |
| 5,396,250 | 3/1995 | Tsui et al. | 342/13 |

OTHER PUBLICATIONS

IEEE, International Microwave Symposium Digest May 24–26, 1994 pp. 1667–1670.

Primary Examiner—Reinhard J. Eisenzopf
Assistant Examiner—Lee Nguyen
Attorney, Agent, or Firm—Bernard E. Franz; Thomas L. Kundert

[57] ABSTRACT

An instantaneous frequency measurement receiver (IFM) is used at each output of a digital channelized receiver. A Fast Frequency Transform (FFT) is used to form an instantaneous frequency measurement (IFM) receiver at every frequency component. These IFM receivers can perform frequency coding and produce fine frequency measurement.

2 Claims, 3 Drawing Sheets

DIGITAL CHANNELIZED IFM RECEIVER

RIGHTS OF THE GOVERNMENT

The invention described herein may be manufactured and used by or for the Government of the United States for all governmental purposes without the payment of any royalty.

BACKGROUND OF THE INVENTION

The present invention relates generally to the field of instantaneous frequency measurement (IFM) receivers with digital processing, and more particularly to a digital channelized IFM receiver.

A related paper by T. W. Fields, D. L. Sharpin and J. B. Tsui titled Digital Channelized IFM Receiver, was presented at the IEEE MTT-S International Microwave Symposium, May 24–26, 1994 at San Diego Calif., and published in the Digest of the Symposium. A copy of the paper is included with this application as filed, and is hereby incorporated by reference.

The conventional IFM receiver is a radio frequency receiver used primarily in electronic warfare. Its basic function is to measure the frequency of pulsed signals radiated from hostile radar. Generally, it may be said that IFM receivers measure the frequencies of incoming RF signals utilizing interferometric techniques by detecting the phase shift magnitudes produced in multiple, calibrated delay lines. For instance, the received RF signal is divided and simultaneously introduced into a non-delayed path and a delay line of known length. Since the delay and non-delayed receiver paths are functions of the input signal frequency, conversion of the phase difference signals to video signals provides signals whose amplitudes are related to phase delay. These signals typically take the form of sin $\omega\tau$ or cos $\omega\tau$, where $\omega$ is the angular frequency or the processed input signal, and $\tau$ is the known delay time. The sin $\omega\tau$ and cos $\omega\tau$ signals are delivered to an encoding network which makes amplitude comparisons of the signals, determines the numerical value of $\omega$, and generates the digital frequency descriptive word.

An IFM receiver has many attractive features necessary for electronic warfare applications, such as small size, light weight, wide instantaneous bandwidth, and fine frequency resolution. In a digital receiver, the incident radiation is mixed with a local oscillator signal and down converted to an intermediate frequency (IF). This IF signal is discretely sampled and further processing is done using digital techniques. The frequency of the incident radiation may be determined by performing a discrete Fourier transform on the sampled signal.

The following United States patents are of interest. U.S. Pat. Nos.

4,612,545—Asendorf et al
4,633,516—Tsui
4,649,536—Kninock
5,198,748—Tsui et al
5,109,188—Sanderson et al
5,214,708—McEachern
5,235,287—Sanderson et al

SUMMARY OF THE INVENTION

An objective of the invention is to provide an improved frequency measurement receiver. Another objective is to provide finer frequency resolution than can be obtained from a channelized receiver.

According to the invention, an instantaneous frequency measurement receiver (IFM) is used at each output of a digital channelized receiver. The IFM receiver can have two possible applications. First, it can be used to determine the output frequency from the channelized receiver. Second, it can generate finer frequency information than obtained from the channelized receiver.

DETAILED DESCRIPTION

An objective of the invention is to build an instantaneous frequency measurement (IFM) receiver at each output of a digital channelized receiver. It can have two possible applications. First, it can be used to determine the output frequency from the channelized receiver. Second, it can generate finer frequency information than obtained from the channelized receiver.

Figure 1:
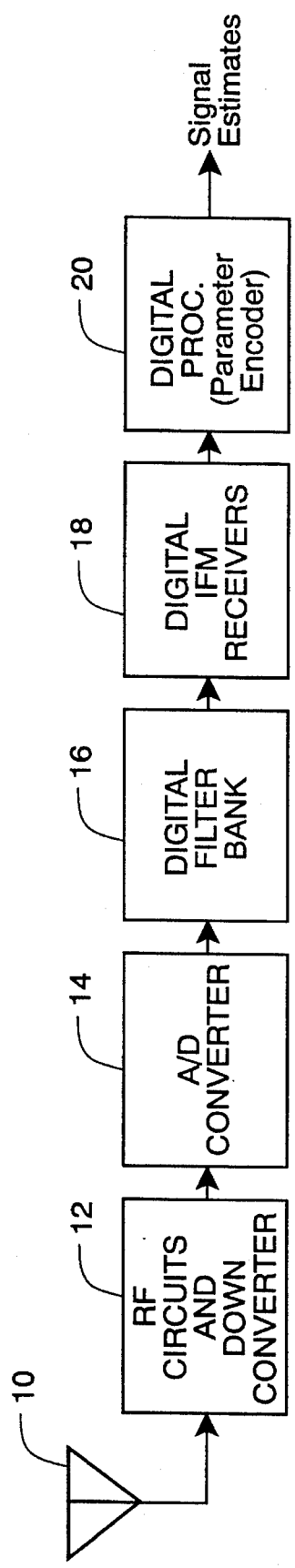
FIG. 1 is a block diagram showing a frequency measurement receiver system having an instantaneous frequency measurement receiver (IFM) at each output of a digital channelized receiver.

FIG. 1 is a block diagram showing a frequency measurement receiver system having an instantaneous frequency measurement receiver (IFM) at each output of a digital channelized receiver. Signals received at an antenna 10 are supplied to block 12 which comprises RF circuits and a down converter. The IF signals from block 12 are supplied to an analog-to-digital converter 14, and the digital signals are channelized in a digital filter bank 16. At block 18, a digital IFM receiver is formed for the output of each digital channel. The digital output signals from block 18 are supplied to a signal processing block 20 to encode the various parameters including the frequencies of the input signals.

Figure 1A:
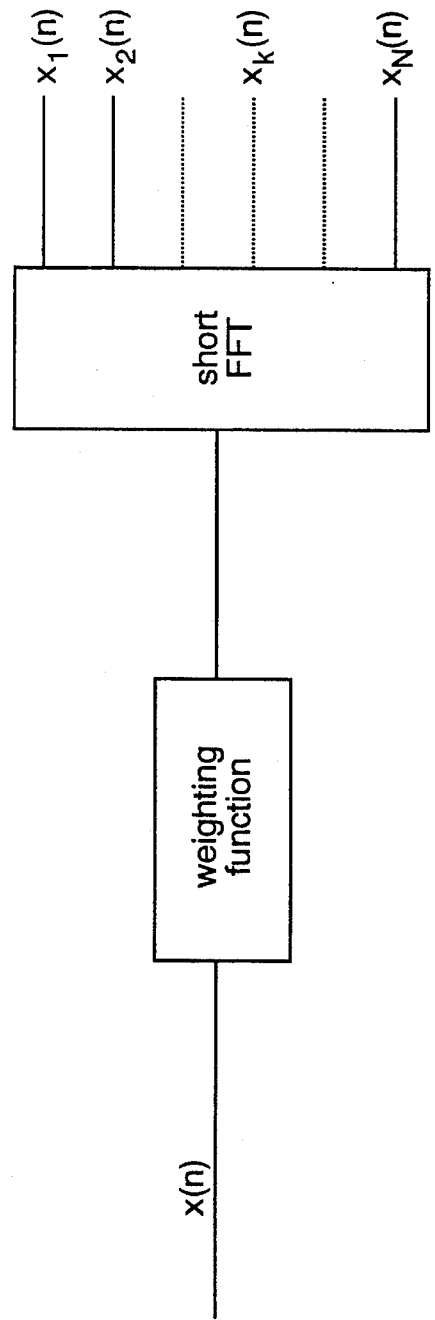
FIG. 1a is a block diagram showing the digital filter bank of FIG. 1.

Using fast Fourier transform (FFT) or its related techniques to build a digital channelized receiver is probably the most promising approach. The most straight forward way is to use a properly selected weighting function to condition the data. A short time FFT operation is used to perform the channelization as shown in FIG. 1a, which shows a simple way to build the digital filter bank 16 for the digital receiver of FIG. 1.

The conventional thought is to compare the amplitude of the outputs from different channels to determine the center of the radio frequency (RF) of the input signal. This approach was experimented many times in analog receiver designs. The results were usually poor. This approach generates many spurious responses, if the dynamic range is high i.e. over 25 dB. The major difficulty is that the gains of all the channels can not be made equal in an analog receiver. The approach may generate better results in a digital receiver, because all of the channels in the receiver are better balanced through the FFT operation.

To improve the frequency resolution from a channelized receiver, IFM receivers are added to the output of every channel in analog channelized receiver design. In the digital channelized receiver, an IFM receiver can be built at each output with no additional hardware. The only requirement in design is to process the output from the channels differently.

Invention Description

This invention can work with the arrangement shown in FIG. 1a and other possible digital channelized receiver designs with FFT to perform the channelization. The only requirement is that the channel output contains the RF information. This information can be either in real or complex form. In the FFT outputs, the channel outputs are complex which makes the IFM receiver very simple. A complex form has in phase (I) and quadrature (Q) components.

Let us use an example to demonstrate this idea. The input contains 1024 data points. In the data points 600 points (from 212 to 812) contain a sine wave. A hanning window is used to modify the input data and 128 point short FFT is used to perform the channelization. Because the input data are real, a 128 point FFT will produce 64 channels. This short FFT is overlapped 127 points. In other words, it is a one point sliding FFT. The output of each channel can be written as $I_i(t_j)$ and $Q_i(t_j)$ where i=1 to 64 representing the output channel number and j=1 to 897 (1024−128+1) representing the output time. From these outputs one can find the phase of the output signal as $$\Theta_i(t_j) = \tan^{-1}\left[\frac{I_i(t_j)}{Q_i(t_j)}\right] \quad (1)$$

The phase difference of each channel can be found as $$\delta\Theta_i(t_j) = \Theta_i(t_{j+1}) - \Theta_i(t_j) \quad (2)$$

The frequency of the output signal can be found from $$f_i = \frac{\delta\Theta_i(t_j)}{t_{j+1} - t_j} \quad (3)$$

This is the conventional approach to find the frequency through an IFM receiver.

A. Application to frequency encoding

Figure 2:
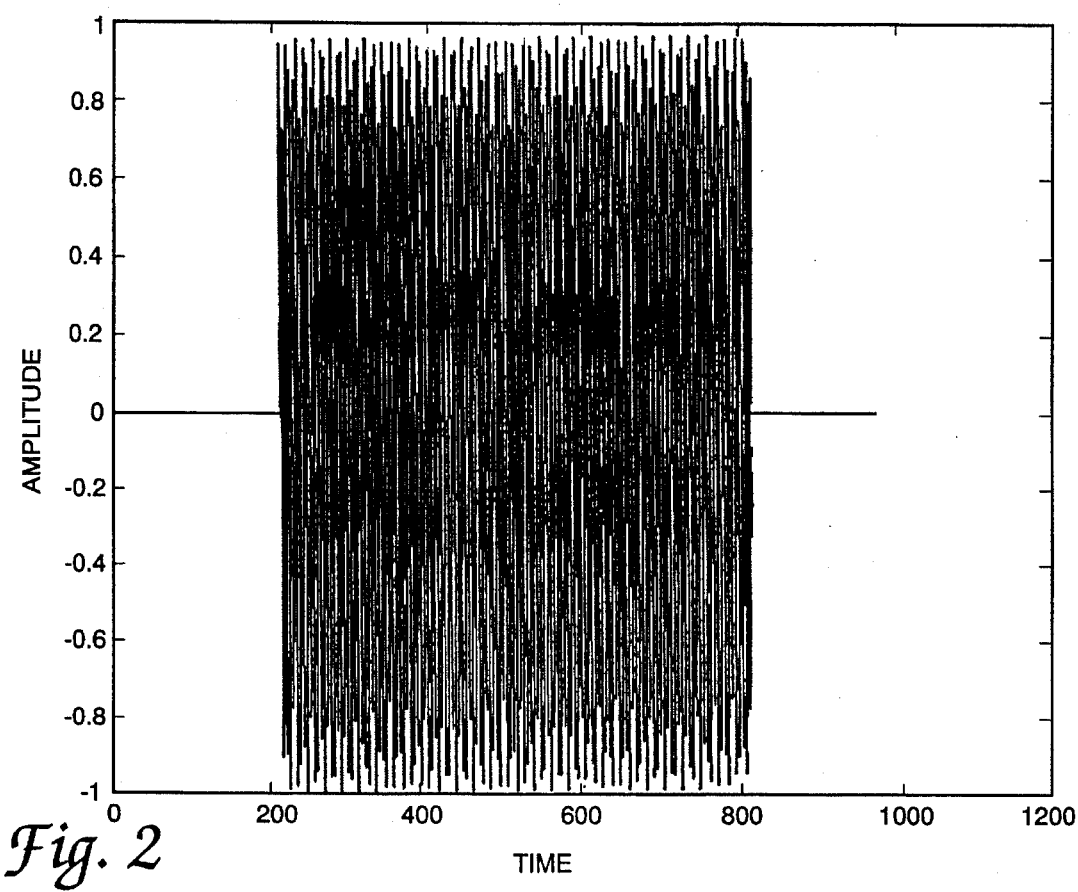
FIG. 2 is a graph of an input signal.
Figure 3:
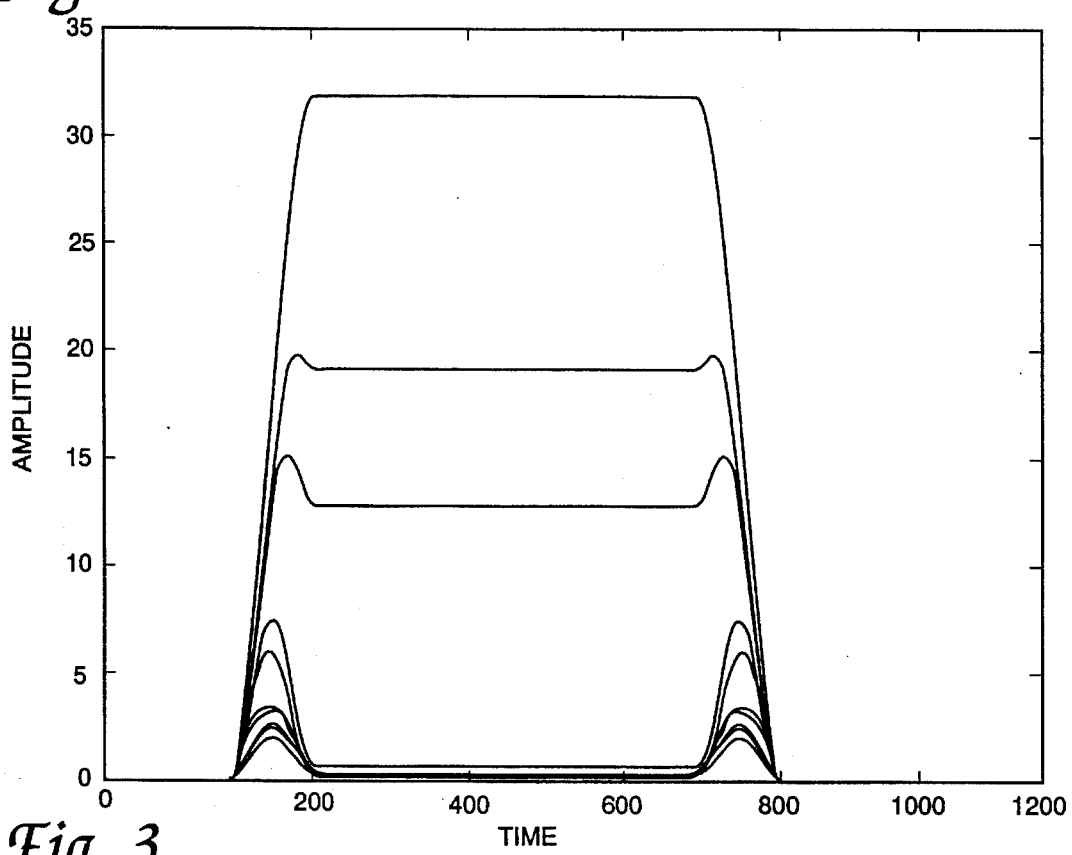
FIG. 3 is a graph showing outputs from ten channels.
Figure 4:
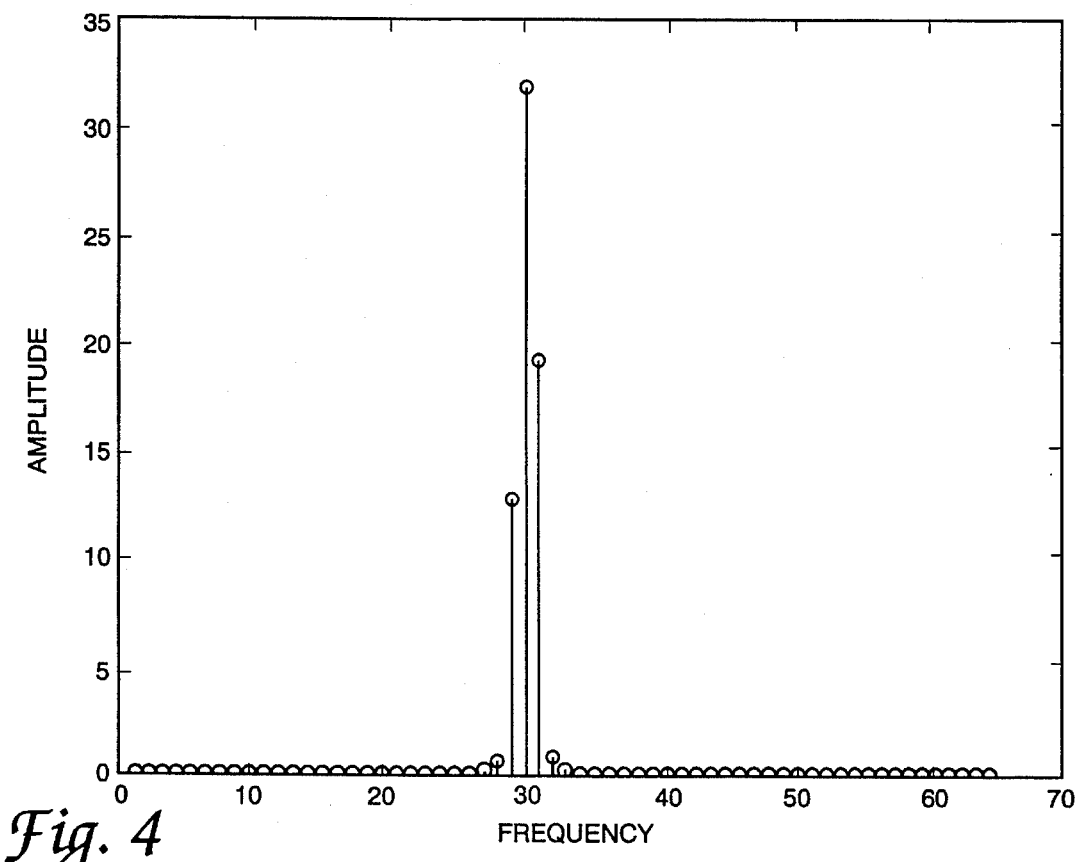
FIG. 4 is a graph showing FFT output in the frequency domain.
Figure 5:
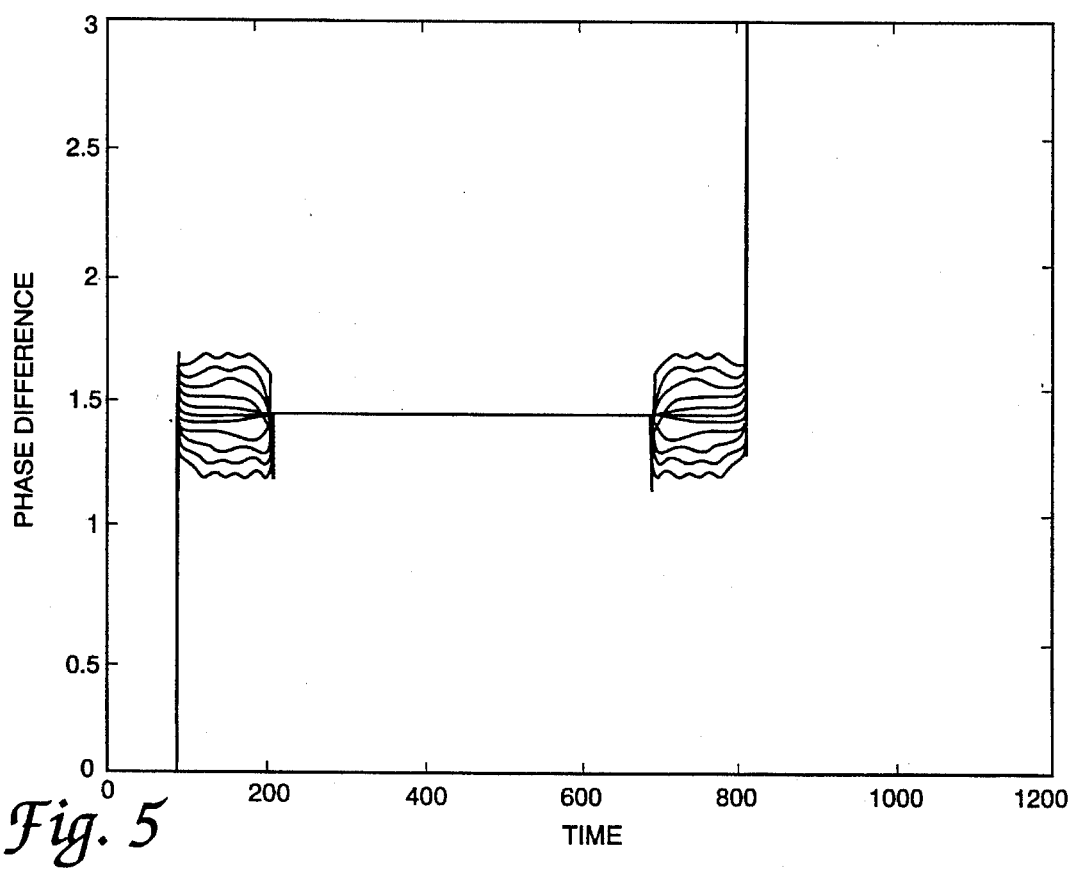
FIG. 5 is a graph of frequency vs. time from ten channels.

In the above example, the input signal is shown in FIG. 2, which is a graph with time as the horizontal axis and amplitude as the vertical axis. The amplitude of the output channels can be found from $$A_i(t_j) = \sqrt{I_i(t_j)^2 + Q_i(t_j)^2} \quad (4)$$

which is shown in FIG. 3. In this figure only 10 channels are plotted. The center channel contains the signal. The transients at both the leading and trailing edges are usually referred to as the rabbit ears. The frequency domain plot at t=400 is shown in FIG. 4. In this figure there are 64 output channels. The result is the same as a regular FFT output. The conventional approach is to compare the amplitudes between channels after the transient to determine the center frequency. The problem is that the amplitude outputs from channels far away from the signal frequency is very low. It is difficult to compare two small quantities without generating error information. In this approach the frequencies of all the channels are measured. The results are shown in FIG. 5 and it contains the same 10 channels. At the leading and trailing edges of the pulse the frequency is close to the centers of the filters. After the leading edge transient the frequency is equal to the signal frequency, if there is only one signal. FIG. 5 shows this result, all ten outputs have the same value. If there are two signals in one channel and their amplitudes are close, more signal processing is required to resolve them which will not be discussed here. If the frequency measured by the IFM receiver matches the center of the channel, that channel contains a signal. If the frequency measured by the IFM receiver does not match the center of the channel, that channel does not contain a signal. Using this measurement, the channels containing signals can be identified.

B. Application to fine frequency measurement

If the channels containing signals can be determined, the IFM receiver can be used to find fine frequency resolution. The frequency resolution of a pulsed signal depends on the length of the pulse which is very desirable for EW application. Fine frequency resolution can be obtained from long delay line. This result can be obtained from the following relation.

$$\delta\Theta_i(t_{mj}) = \Theta_i(t_{j+m}) - \Theta_i(t_j) \quad (5)$$

The phase difference is obtained from the phase m samples away in time, rather that the adjacent ones in the time domain. The corresponding frequency of the output signal can be found from $$f_i = \frac{\delta\Theta_i(t_{mj})}{t_{j+m} - t_j} \quad (6)$$

However, this equation does not show the improvement in frequency resolution explicitly. The improvement comes from the phase angle measurement. The phase angle is limited to 360 degrees. If the phase difference between m samples is measured, there is ambiguity but the frequency resolution is good and this is a common approach to improve the resolution from IFM receiver. The ambiguity problem can be solved by properly choosing the m value.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

I claim:

1. A digital channelized IFM (Instantaneous Frequency Measurement) receiver comprising first means for receiving RF input signals from antenna means and for converting the RF input signals to IF signals, analog-to-digital conversion means coupled to the first means for converting the IF signals to digital signals at D data points, the analog-to-digital conversion means being coupled to digital filter bank means for providing channelized digital signals using a P point short FFT (Fast Fourier Transform) to perform the channelization to provide i=1 to P/2 channels, digital IFM receiver means for processing the channelized digital signals to effectively provide digital IFM receiver means for the output of each channel;

wherein the short FFT is overlapped P−1 points, and the output of each channel is written as $I_i(t_j)$ and $Q_i(t_j)$ where I and Q are inphase and quadrature components of a complex form, i represents output channel number, and j=1 to (D−P+1) represents the output time, and the means for finding a phase $\Theta_i$ of each output signal as $$\Theta_i(t_j) = \tan^{-1}\left[\frac{I_i(t_j)}{Q_i(t_j)}\right]$$

means for finding the phase difference of each channel as $$\delta\Theta_i(t_j) = \Theta_i(t_{j+1}) - \Theta_i(t_j)$$

and means for finding the frequency of the output signal from $$f_i = \frac{\delta\Theta_i(t_j)}{t_{j+1} - t_j} \; ;$$

wherein the frequencies of all channels are measured, if the frequency measured by an IFM receiver matches the center of a channel, that channel contains a signal, and if the frequency measured by the IFM receiver does not match the center of the channel, that channel does not contain a signal, so that using this measurement, the channels containing signals can be identified.

2. A digital channelized IFM receiver according to claim 1, wherein after channels containing signals are determined, the IFM receiver is used to find fine frequency resolution, means for finding fine frequency resolution obtained from the following relation $$\delta\Theta_i(t_{mj}) = \Theta_i(t_{j+m}) - \Theta_i(t_j)$$

with the phase difference being obtained from the phase m samples away in time, rather than the adjacent ones in the time domain, the corresponding frequency of the output signal being be found from $$f_i = \frac{\delta\Theta_i(t_{mj})}{t_{j+m} - t_j} \; .$$

* * * * *